United States Patent [19]

Kawamura et al.

[11] Patent Number: 5,127,988
[45] Date of Patent: Jul. 7, 1992

[54] PROCESS FOR THE SURFACE TREATMENT OF CONDUCTIVE MATERIAL

[75] Inventors: Shingo Kawamura, Asahi; Minoru Yamada, Kurobe; Mioko Ito, Kamiichi; Akira Ohmura, Kurobe; Yoshimasa Yagi, Nyuzen, all of Japan

[73] Assignee: Yoshida Kogyo K.K., Tokyo, Japan

[21] Appl. No.: 619,983

[22] Filed: Nov. 30, 1990

[30] Foreign Application Priority Data

Dec. 27, 1989 [JP] Japan .................................. 1-336479
Sep. 21, 1990 [JP] Japan .................................. 2-250018

[51] Int. Cl.$^5$ ............................................ H01L 21/00
[52] U.S. Cl. .................................. 156/643; 156/345; 204/192.32
[58] Field of Search ........................ 156/643, 345; 204/192.32

[56] References Cited

U.S. PATENT DOCUMENTS

| | | | |
|---|---|---|---|
| 4,222,838 | 9/1980 | Bhagat et al. | 204/192.32 |
| 4,233,109 | 11/1980 | Nishizawa | 156/643 |
| 4,434,038 | 2/1984 | Morrison, Jr. | 204/192.32 |
| 4,889,588 | 12/1989 | Fior | 156/643 |

OTHER PUBLICATIONS

"Thin Film Processes"; ed. by Vossen and Kern; ©1978; N.Y., N.Y.; Academic Press; pp. 38–63.

Primary Examiner—David A. Simmons
Assistant Examiner—George Goudreau
Attorney, Agent, or Firm—Flynn, Thiel, Boutell & Tanis

[57] ABSTRACT

Disclosed is a process for the surface treatment of a conductive material which comprises the steps of disposing a DC electrode having a base material of the conductive material thereon and an RF electrode in a reaction vessel so that the electrodes are parallel to each other; forming a reduced pressure space of a predetermined gas in the vessel; and applying simultaneously a direct current voltage to the DC electrode and a radio-frequency power to the RF electrode so that a surface of the base material is subjected to bombardment treatment under DC discharge and RF discharge. Since the surface treatment of the present invention is effected while causing DC discharge and RF discharge simultaneously, film formation can be made on the thus surface-treated base material with a good adhesion. Further, an abnormal surface layer formed by electric discharge machining can be readily removed without leaving its corner portion and residual tensile stress introduced by electric discharge machining can also be relieved.

6 Claims, 6 Drawing Sheets

FIG.5a I
FIG.5a II
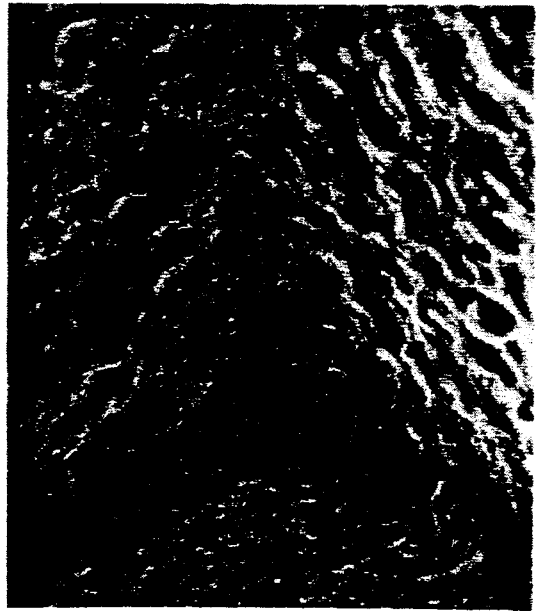
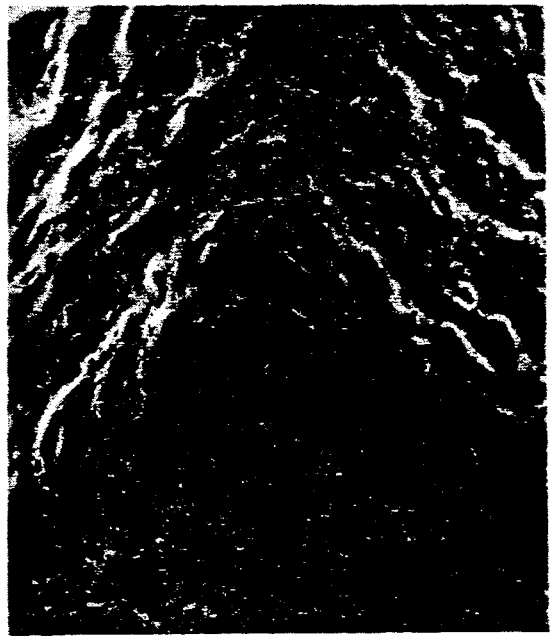
FIG.5b
FIG.5c
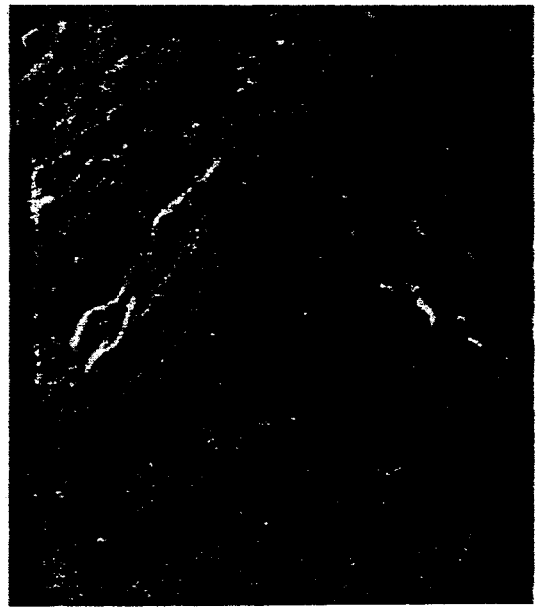

PROCESS FOR THE SURFACE TREATMENT OF CONDUCTIVE MATERIAL

BACKGROUND OF THE INVENTION

1. Field of the Invention

The present invention relates to a process for the surface treatment of conductive materials through a bombardment process using a plasma assisted chemical vapor deposition (CVD) apparatus.

2. Description of the Prior Art

Heretofore, when a conductive material is surface-treated by means of a bombardment process utilizing a plasma assisted CVD apparatus, the inside of a sealed vessel disposed in the apparatus is evacuated to form a reduced pressure space of a certain gas and a direct current voltage is applied to a DC electrode having a base material made of the conductive material to effect bombardment under DC discharge.

However, in such a conventional bombardment treatment, the etching rate of a surface of the base material is slow and an oxide layer and other layers firmly adhering onto the surface of the base material are not entirely removed. Therefore, it is impossible to obtain a clean surface of the base material. As a result, for example, in the subsequent film formation step, a film is not always bonded directly to the base material surface and there is a problem in the adhesion of the film to the base material.

SUMMARY OF THE INVENTION

Accordingly, it is an object of the present invention to obtain an active and clean base material surface by strongly and efficiently surface-treating a base material through a bombardment process for a short period of time and thereby improve the adhesion of a film coating to the base material.

In accordance with the present invention, there is provided a process for the surface treatment of a conductive material which comprises the steps of:

disposing a DC electrode having a base material made of the conductive material thereon and an RF electrode in a reaction vessel so that these electrodes are parallel to each other;

forming a reduced pressure space of a predetermined gas in the vessel; and applying simultaneously a direct current voltage to the DC electrode and a radio-frequency power to the RF electrode so that a surface of the base material is subjected to bombardment treatment under DC discharge and RF discharge.

BRIEF DESCRIPTION OF THE DRAWINGS

Similarly.

FIGS. 5(aI), 5(aII), 5(b) and 5(c) are SEM photographs showing the surface changes due to surface treatments.

DETAILED DESCRIPTION OF THE PREFERRED EMBODIMENTS

Figure 1:
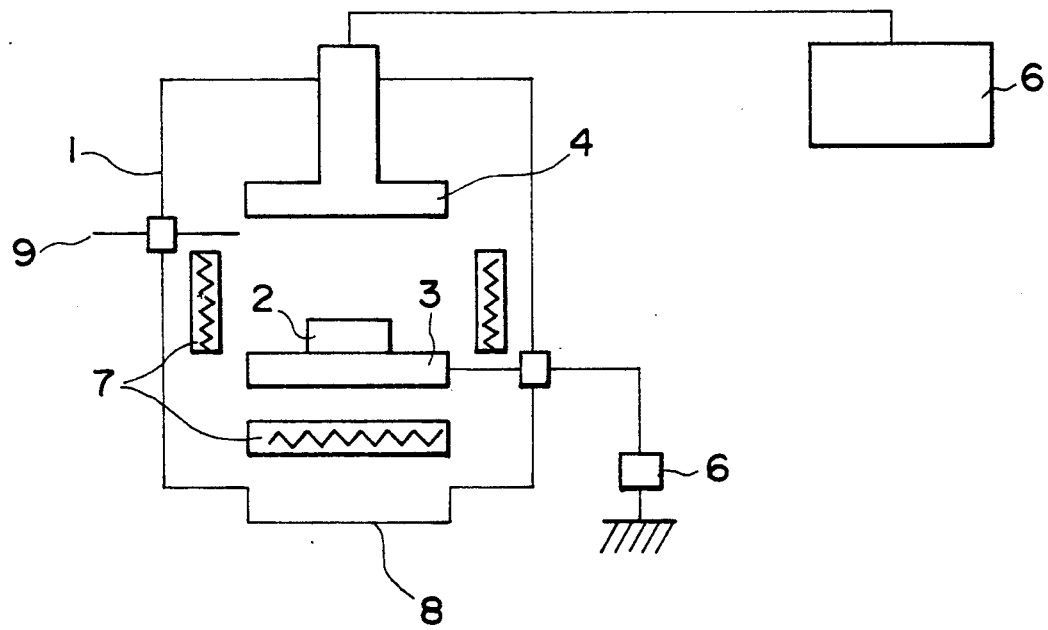
FIG. 1 is a schematic diagram of a plasma assisted CVD apparatus used for practicing the present invention.

In the present invention, a plasma discharge field is formed around a base material disposed in a reduced pressure space and plasma discharge occurs both from a DC electrode and an RF electrode by applying a direct current voltage to the DC electrode and a radio-frequency power to the RF-electrode, simultaneously.

In this process, the pressure of the discharging space is set to a relatively low pressure of the order of from $1 \times 10^{-3}$ to 0.1 Torr and the plasma field is formed so that the base material is subjected to a strong ion bombardment. Under such conditions, a layer of contaminants such as oxide, etc., adhering on the base material can be successfully removed. If the ion-bombardment is carried out under a pressure employed for an ordinary plasma CVD process, a mean free path of atoms and molecules is shorter than the size of the base material. Therefore, when the plasma discharge is too strong, atoms or molecules of contaminants, expelled by discharge cleaning from the surface of the base material having a complicated shape, are adsorbed again onto certain portions of the cleaned base material surface so that they are allowed to firmly bond again to the base material. Therefore, a relatively low pressure space as described above is preferable for the bombardment treatment of the present invention.

In bombardment only by DC discharge, secondary electrons generated from the DC electrode run straight into and collide with atoms or molecules of an atmospheric gas so that the gas is ionized. The thus formed ions are urged toward the DC electrode and strike against the base material mounted onto the DC electrode, thereby promoting the etching of the base material surface.

In contrast to this, when bombardment treatment is carried out by a combination of RF discharge and DC discharge, secondary electrons are expelled both from an RF electrode and a DC electrode and, in addition to ionization caused due to straight movement of the secondary electrons, reciprocal movement of the secondary electrons also occurs in the discharge space due to RF discharge. This reciprocal movement of the secondary electrons further increases the possibility of collision of atoms and molecules of an atmospheric gas and ionization is greatly accelerated. As a result, a very large quantity of ions are produced as compared with the above-mentioned bombardment only by DC discharge. The thus produced ions are, as set forth above, urged toward the DC electrode and more efficiently promote the etching of a base material than in the case of the DC bombardment.

DC voltages ranging from $-0.5$ to $-3.0$ kV and RF electrode self-bias voltages ranging from $-0.05$ to $-2.0$ kV are preferable for the present invention. Further, in order to practice surface treatment of a base material by bombarding ions onto the base material surface, it is essential that the absolute value of the DC voltage be higher than the absolute value of the RF electrode self-bias voltage.

Inert gases of Ar, Kr, etc., and H₂, which are applicable in chemical etching, are preferable for the bombardment treatment of the present invention.

As applicable base materials, there may be exemplified metallic materials like SKD 11, SKH 51, hard metals (cemented carbides) and other electrically conductive materials.

Hereinafter, the present invention will now be described in detail by reference to the following examples and comparative examples.

EXAMPLE 1

FIG. 1 is a drawing schematically illustrating a capacitive coupling type plasma assisted CVD apparatus. A DC electrode 3 having a base material 2 and an RF electrode 4 are disposed in a reaction vessel 1 so that they are parallel to each other. A direct current voltage is applied to the DC electrode 3 by a DC source 5 and a radio-frequency voltage is applied to the RF electrode 4 by an RF source 6. Reference numeral 7 in the drawing represents a heater. The reaction vessel 1 is evacuated to reduce the pressure inside the vessel 1 by a vacuum system 8 and gas 9 is sealed within the vessel 1.

In the above-mentioned apparatus, an RF-DC bombardment treatment using DC discharge and RF discharge and a DC bombardment treatment using only DC discharge were carried out under the respective conditions specified in the following Table 1.

TABLE 1

|  | RF-DC Bombardment | DC Bombardment |
|---|---|---|
| Applied DC voltage | −1.2 kV | −1.2 kB |
| RF self-bias voltage | −0.2 kV | — |
| Pressure (torr) | $2 \times 10^{-2}$ | $2 \times 10^{-2}$ |
| Gas | Ar | Ar |
| Base material | SKD11, SKH51 | SKD11, SKH51 |

Figure 2A:
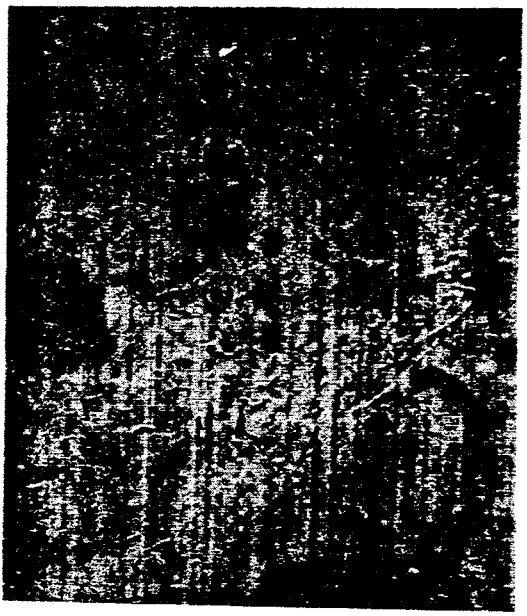
FIG. 2(a), 2(b) and 2(c) are SEM (scanning electron microscopy) photographs showing the microstructural surface change of a base material made of a cold work steel (designated as SKD 11 by JIS) due to bombardment.

FIG. 2(a) is an SEM (scanning electron microscopy) photograph of the surface of a base material of SKD 11 (HRC-61) before the bombardment treatment.

Figure 2B:
Figure 2C:

FIG. 2(b) is an SEM photograph of the same base material after receiving the RF-DC bombardment for a period of 60 minutes. FIG. 2(c) is an SEM photograph of the same base material after being subjected to the DC bombardment for a period of 60 minutes.

In FIG. 2(c), any substantial change is hardly observed although very slight etching is detected. In contrast to this, FIG. 2(b) shows that carbides inherent to SKD 11 appear and etching has substantially proceeded. The reason for this is considered to be that Ar ionization is greatly promoted by using a combination of RF discharge and DC discharge and the surface of the base material is etched with a high efficiency.

Figure 3A:
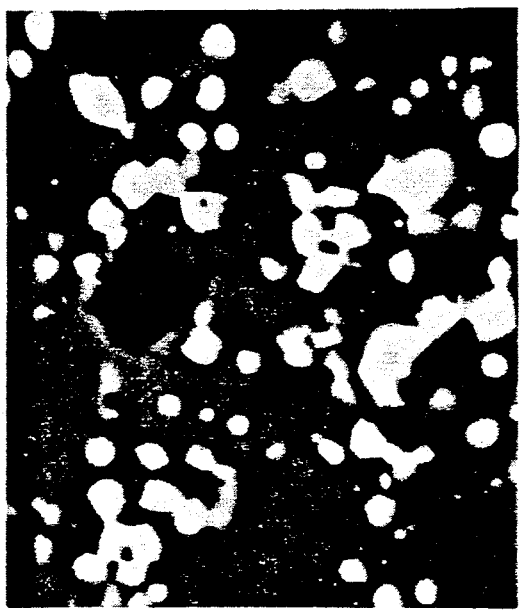
FIGS. 3(a), 3(b) and 3(c) are SEM photographs of the microstructural surface change of a base material made of a high speed steel (designated as SKH 51 by JIS) due to bombardment.
Figure 3B:
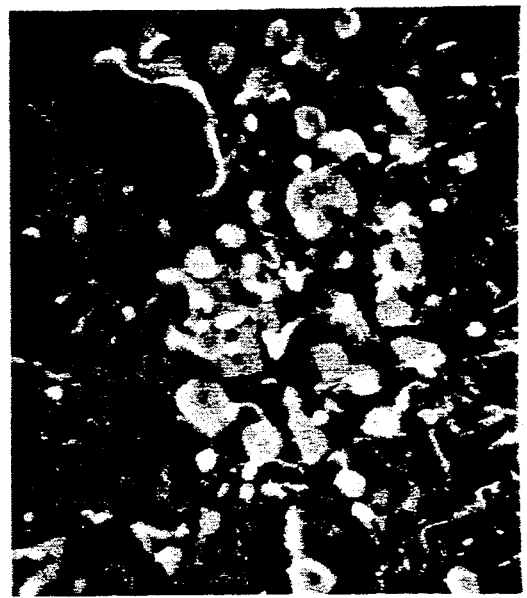
Figure 3C:
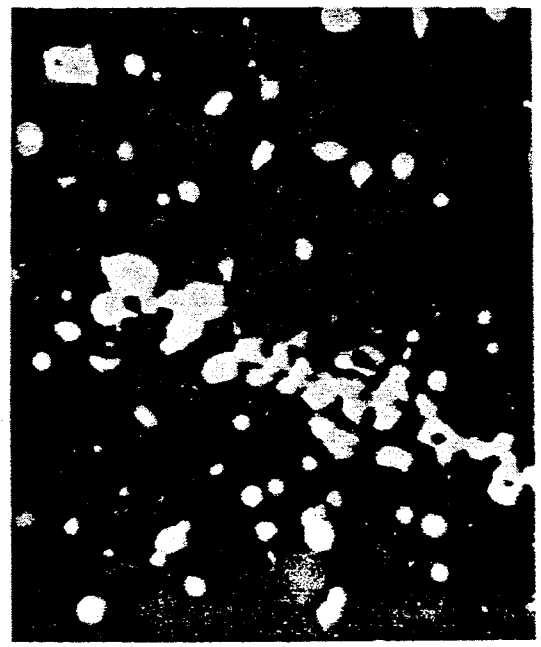

FIG. 3(a) is an SEM photograph of the surface of a base material of SKH 51 before bombardment and FIG. 3(b) is an SEM photograph of the surface of the same base material after receiving the RF-DC bombardment for a period of 60 minutes and FIG. 3(c) is an SEM microphotograph of the surface of the same base material after being subjected to the DC bombardment for a period of 60 minutes. The results were the same as in the case of the SKD 11 base material.

Among the base materials bombarded as specified above, the SKH 51 base material was coated with a TiN film. For the formation of the TiN film, titanium halide compound gas, nitrogen gas and hydrogen gas were introduced into the reaction vessel 1 and film formation was effected under the following conditions.

RF power: 4–8 kW
Bias voltage applied onto the base material: −100 V
Temperature of the base material: about 500 °C.
Pressure: 0.3 Torr.

The hardness of the TiN film so formed was of the order of 2000 to 2500 kg/mm² in terms of Vickers hardness (measured under 25 gf). The adhesion of the TiN film was evaluated by using a scratch tester. The obtained test results are shown in Table 2 below and the RF-DC bombardment shows a higher adhesion level than the DC bombardment in the scratch test.

TABLE 2

| Type of Bombardment | RF-DC Bombardment | DC Bombardment |
|---|---|---|
| Adhesion (Scratch Test) | 35N | 25N |

EXAMPLE 2

Figure 4:
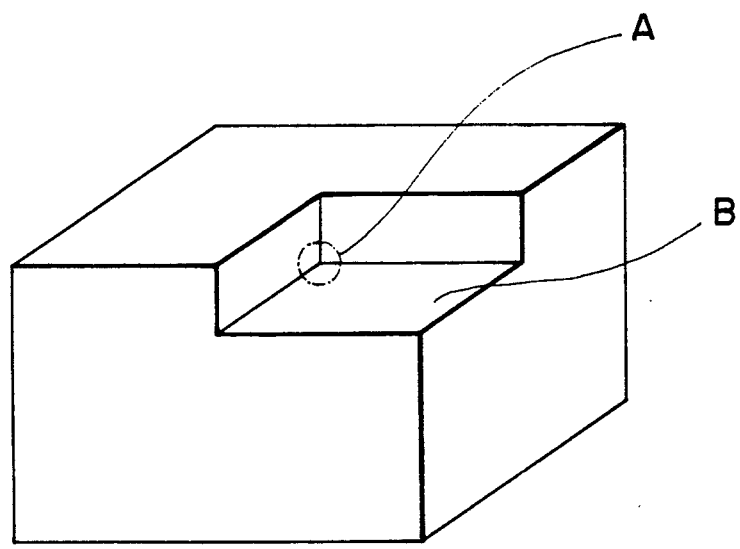
FIG. 4 is a schematic view of a test sample.

In the apparatus used in Example 1, a base materials, which had been subjected to electric discharge machining as shown in FIG. 4, was mounted onto the DC electrode 3 and RF-DC bombardment was carried out under the conditions given in Table 3 below to examine the state of removal of an abnormal surface layer which has been formed on the base material surface by the electric discharge machining. As the base material, each of the materials shown in table 3 was used.

TABLE 3

|  | RF-DC Bombardment |
|---|---|
| Applied DC voltage | −1.5 kV |
| RF self-bias voltage | −0.5 kV |
| Pressure (torr) | $1.5 \times 10^{-2} - 2 \times 10^{-2}$ |
| Gas | Ar |
| Base material | WC-15 wt. % Co, SKD11, SKH51 |

For comparison purposes, the abnormal surface layer formed on each of the above base materials by the electric discharge machining was removed by a conventional machining treatment (lapping).

The removal state of the abnormal surface layer was observed through the SEM image of the corner portion (portion "A" shown in FIG. 4) for each base material treated as set forth above.

FIGS. 5(aI) and 5(aII) are SEM images of the portion "A" of two samples of SKD 11 which were subjected to the electric discharge machining. FIG. 5(b) is an SEM image of the portion A of the sample shown in FIG. 5(aI) after receiving the conventional machining treatment. FIG. 5(c) is an SEM image of the portion "A" of the sample shown in FIG. 5(aII) after receiving the invention RF-DC bombardment treatment.

From observation through the SEM images, it is clear that the abnormal surface layer formed on the portion A by the electric discharge machining can be hardly removed by the conventional machining process, but the same layer can be almost completely removed by the inventive RF-DC bombardment.

Figure 6:
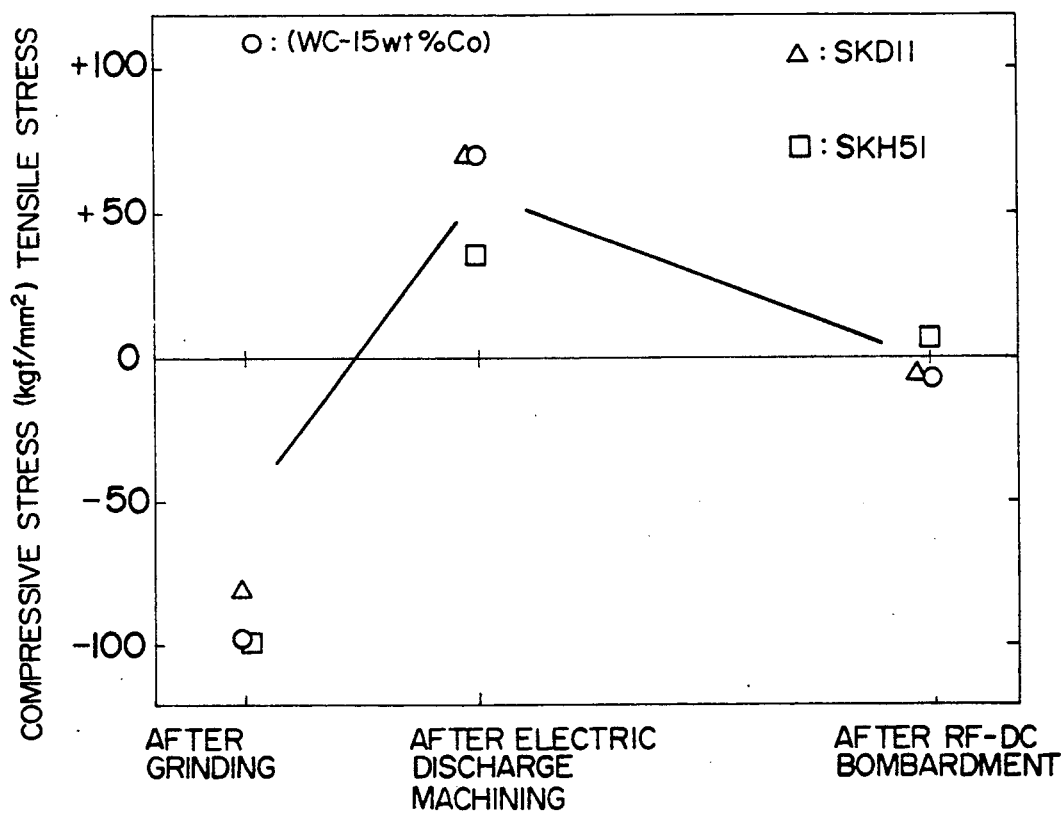
FIG. 6 is a graph showing the results of residual stress measurements.

Further, residual stress was measured for the face "B" of each base material after each surface treatment, using an X-ray diffraction stress analyzer. The results are shown in FIG. 6. As shown in FIG. 6, the samples of the above different materials all showed a residual compressive stress of the order of about −70 kgf/mm² after grinding, but after they were subjected to electric discharge machining, they showed a residual tensile stress of the order of about +50 kgf/mm². It is clear that the mechanical properties were deteriorated. However, it can be seen that such a residual tensile stress can be relieved by the inventive RF-DC bombardment.

Further, processed amounts by the FR-DC bombardment of the present invention for a period of 12 hours were measured in terms of etched thickness (μm) for the respective base materials of WC-15 wt. % Co, SKD 11 and SKH 51. The results are shown in Table 4.

TABLE 4

| Base material | Processed amount (μm) |
|---|---|
| WC-15 wt. % Co | 14.5 |
| SKD11 | 16.3 |
| SKH51 | 21.3 |

For comparison, the SKD 11 was subjected to the conventional DC bombardment for 12 hours and the processed amount was measured. The measurement result showed about 4 μm.

It is clear from the above results that the processed amount, i.e., 16.3 μm, by the RF-DC bombardment is very large as compared with about the processed amount of 4 μm by the conventional DC bombardment treatment.

In accordance with the present invention, etching of a base material is performed with a high efficiency by the RF-DC bombardment in a plasma assisted CVD apparatus and film formation can be successfully effected onto the base material so etched, with an excellent adhesion.

Further, the RF-DC bombardment process of the present invention makes possible the removal of corner portions of the abnormal surface layer formed by electric discharge machining which can not be removed by any known machining procedure. Also, residual tensile stress, which may be introduced by electrical discharge machining, can be relieved and a very high processing efficiency can be attained by the RF-DC bombardment for a short period.

What is claimed is:

1. A process for the surface treatment of a conductive material which comprises the steps of:
   providing a reaction vessel;
   disposing a DC electrode and a RF electrode in said reaction vessel parallel to each other, said DC electrode being connected to a direct current voltage source and said RF electrode being connected to a radio-frequency voltage source;
   disposing said conductive material on a surface of said DC electrode so that the conductive material faces said RF electrode;
   forming a reduced pressure space containing an inert gas in said vessel; and
   applying simultaneously a direct current voltage to said DC electrode and a radio-frequency voltage to said RF electrode so that said conductive material is subjected to bombardment treatment under DC discharge and RF discharge, the absolute value of the DC voltage being higher than the absolute value of the RF electrode self-bias voltage.

2. A process according to claim 1, wherein the gas is argon, the applied DC voltage is $-1.2$ kv and the RF is self-bias voltage is $-0.2$ kV.

3. A process according to claim 1, wherein the gas is argon, the applied DC voltage is $-1.5$ kV and the RF self-bias voltage is $-0.5$ kV.

4. A process according to claim 1, wherein the applied DC voltage is between $-0.5$ to $-3.0$ kv and the RF self-bias voltage is between $-0.05$ to $-2.0$ kV.

5. A process according to claim 1, wherein the inert gas is selected from the group consisting of Ar, Kr and $H_2$.

6. A process according to claim 1, wherein the reduced pressure space is in the range of from $1 \times 10^{-3}$ to 0.1 Torr.

* * * * *

UNITED STATES PATENT AND TRADEMARK OFFICE
CERTIFICATE OF CORRECTION

PATENT NO. : 5,127,988
DATED : July 7, 1992
INVENTOR(S) : Shingo KAWAMURA et al

It is certified that error appears in the above-identified patent and that said Letters Patent is hereby corrected as shown below:

Column 6, line 25; change "kv" to ---kV---.
line 25; change "RF is" to ---RF---.

Signed and Sealed this

Eighteenth Day of January, 1994

Attest:

BRUCE LEHMAN

Attesting Officer    Commissioner of Patents and Trademarks